(12) United States Patent
Bizen et al.

(10) Patent No.: US 12,406,826 B2
(45) Date of Patent: Sep. 2, 2025

(54) CHARGED PARTICLE BEAM DEVICE AND SAMPLE OBSERVATION METHOD

(71) Applicant: Hitachi High-Tech Corporation, Tokyo (JP)

(72) Inventors: Daisuke Bizen, Tokyo (JP); Natsuki Tsuno, Tokyo (JP); Yasuhiro Shirasaki, Tokyo (JP); Yohei Nakamura, Tokyo (JP); Satoshi Takada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 429 days.

(21) Appl. No.: 18/015,605

(22) PCT Filed: Sep. 18, 2020

(86) PCT No.: PCT/JP2020/035486
§ 371 (c)(1),
(2) Date: Jan. 11, 2023

(87) PCT Pub. No.: WO2022/059171
PCT Pub. Date: Mar. 24, 2022

(65) Prior Publication Data
US 2023/0253180 A1 Aug. 10, 2023

(51) Int. Cl.
*H01J 37/28* (2006.01)
*H01J 37/20* (2006.01)
*H01J 37/244* (2006.01)

(52) U.S. Cl.
CPC ............ *H01J 37/28* (2013.01); *H01J 37/20* (2013.01); *H01J 37/244* (2013.01)

(58) Field of Classification Search
CPC .......... H01J 37/28; H01J 37/20; H01J 37/244; H01J 2237/2803; H01J 37/228;
(Continued)

(56) References Cited

U.S. PATENT DOCUMENTS 5,585,691 A * 12/1996 Washburn ................ H04N 9/24
313/411
10,204,761 B2 * 2/2019 Sunaoshi ................ H01J 37/18
(Continued)

FOREIGN PATENT DOCUMENTS

TW 539845 B 7/2003
TW 201329420 A 7/2013
(Continued)

OTHER PUBLICATIONS

International Search Report of PCT/JP2020/035486 dated Dec. 1, 2020.
(Continued)

*Primary Examiner* — David A Vanore
(74) *Attorney, Agent, or Firm* — MATTINGLY & MALUR, PC

(57) ABSTRACT

A charged particle optical system scans a sample with a pulsed charged particle beam and detects secondary charged particles; and a scan image is formed. Control is carried out so that a deflection signal for deflecting the charged particle beam in a first direction, a first timing for pulsed irradiation, a second timing for pulsed irradiation, and a third timing for detection of the secondary charged particles are synchronized. When the deflection amount of the charged particle beam in the time period of the first timing corresponds to the coordinates of n pixels in the scan image, the same line is scanned m times (m<n) while shifting the first timing with respect to the deflection signal so that a location irradiated with the charged particle beam by each scanning has different pixel coordinates. The pixel values at pixel coordinates where a signal is defective are restored.

15 Claims, 9 Drawing Sheets

(58) Field of Classification Search
CPC ..... H01J 37/265; G01N 23/2251; G06N 3/09; G06N 20/00; H01L 22/00
See application file for complete search history.

(56) References Cited

U.S. PATENT DOCUMENTS

| | | | |
|---|---|---|---|
| 10,541,106 B2* | 1/2020 | Kumamoto | H01J 37/28 |
| 2008/0121803 A1* | 5/2008 | Shojo | H01J 37/153 |
| | | | 250/311 |
| 2012/0287258 A1* | 11/2012 | Tsuneta | H01J 37/28 |
| | | | 348/80 |
| 2014/0246585 A1* | 9/2014 | Ohashi | G01B 15/04 |
| | | | 250/310 |
| 2016/0307726 A1* | 10/2016 | Hatakeyama | H01J 37/265 |
| 2017/0221676 A1* | 8/2017 | Sunaoshi | H01J 37/28 |
| 2018/0358199 A1* | 12/2018 | Kumamoto | H01J 37/28 |
| 2020/0294764 A1* | 9/2020 | Takaguchi | H01J 37/22 |
| 2022/0059317 A1* | 2/2022 | Shouji | H01J 37/28 |

FOREIGN PATENT DOCUMENTS

| | | | |
|---|---|---|---|
| TW | 201634917 A | 10/2016 | |
| WO | 2019/102603 A1 | 5/2019 | |
| WO | 2020/053967 A1 | 3/2020 | |

OTHER PUBLICATIONS

Notice of Decision to grant a patent dated May 2, 2022, issued in corresponding Taiwan Patent Application No. 110132599.

* cited by examiner

[FIG. 1A]
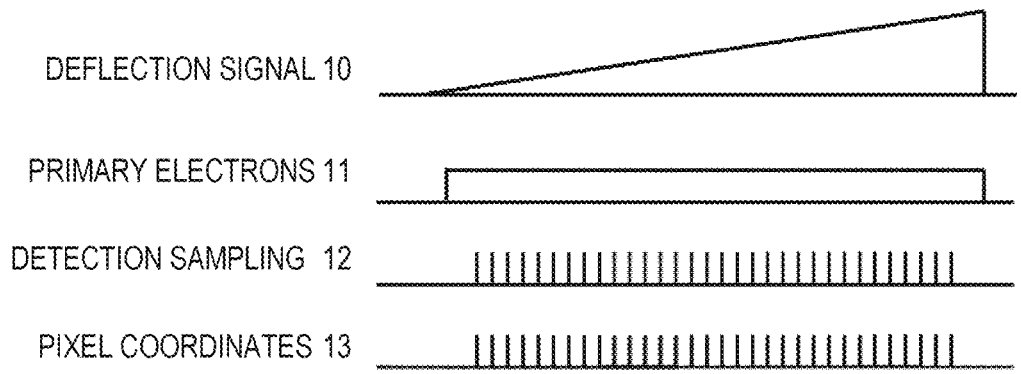
[FIG. 1B]
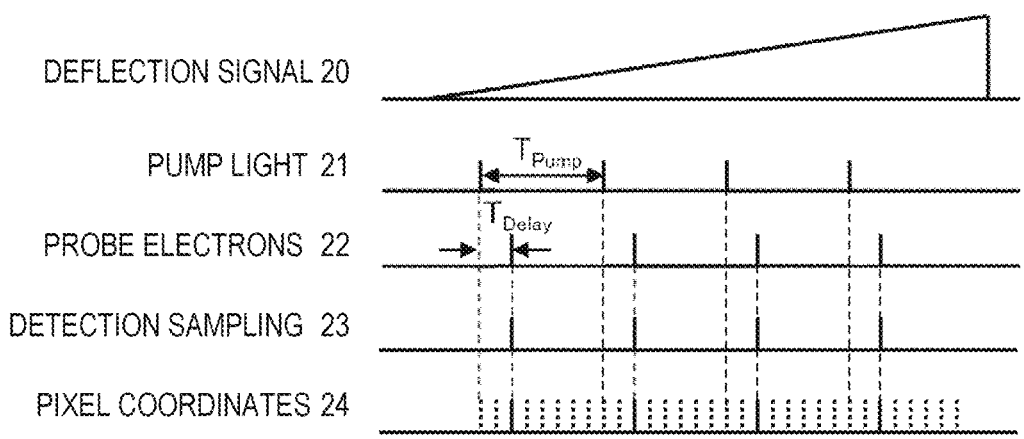

[FIG. 2]
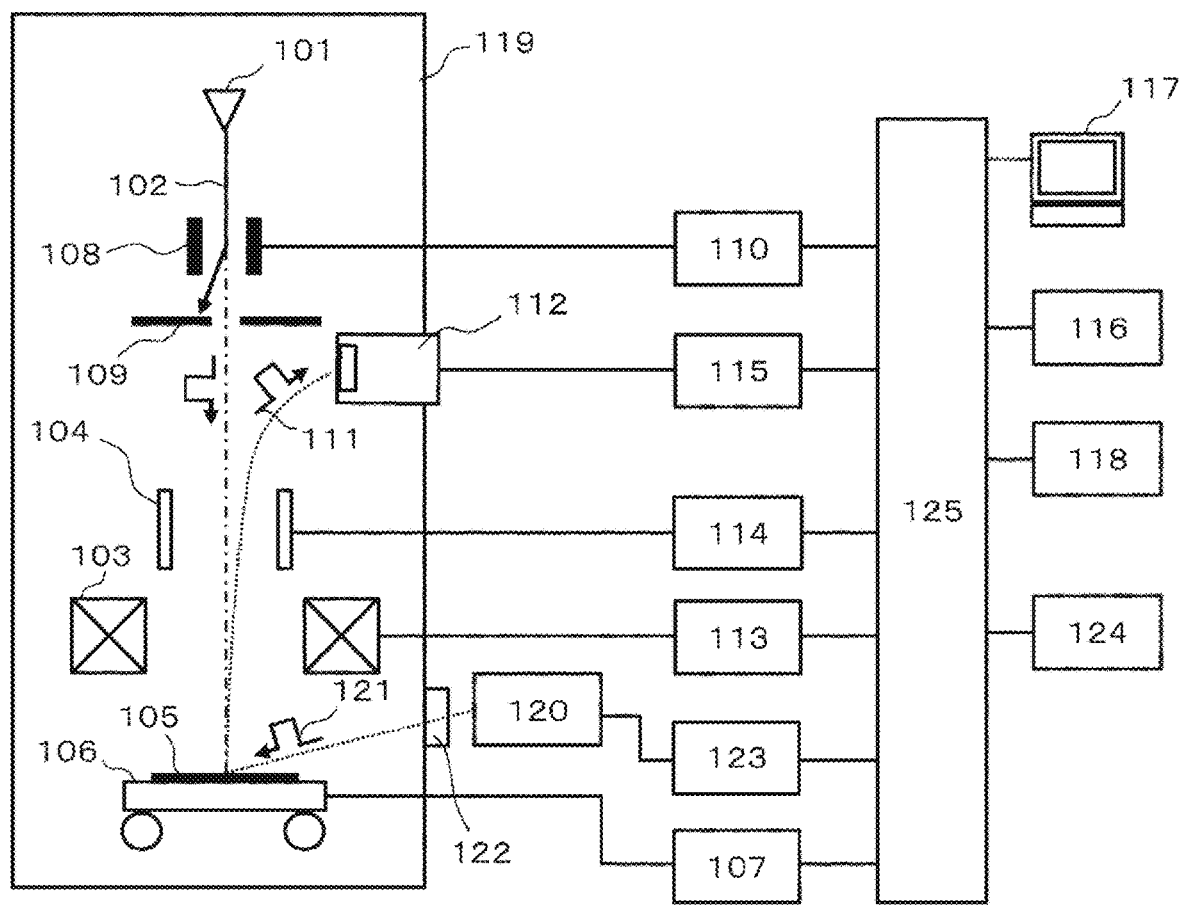

[FIG. 3]
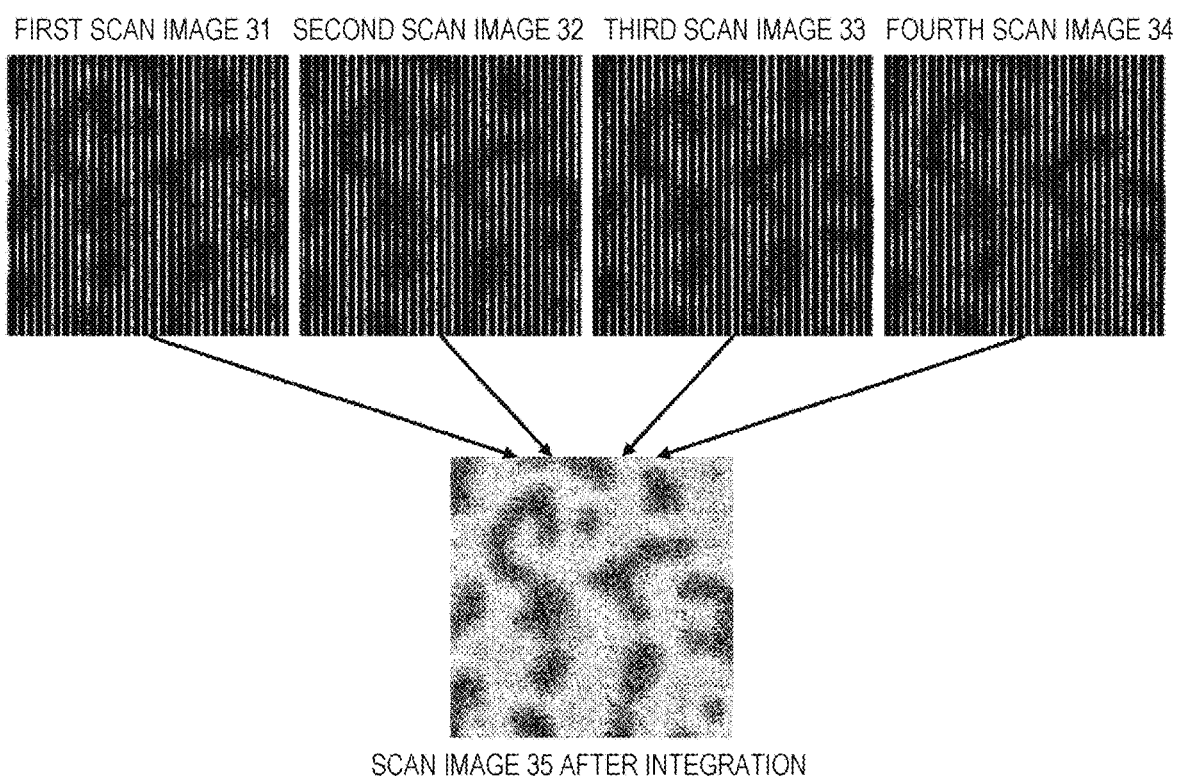

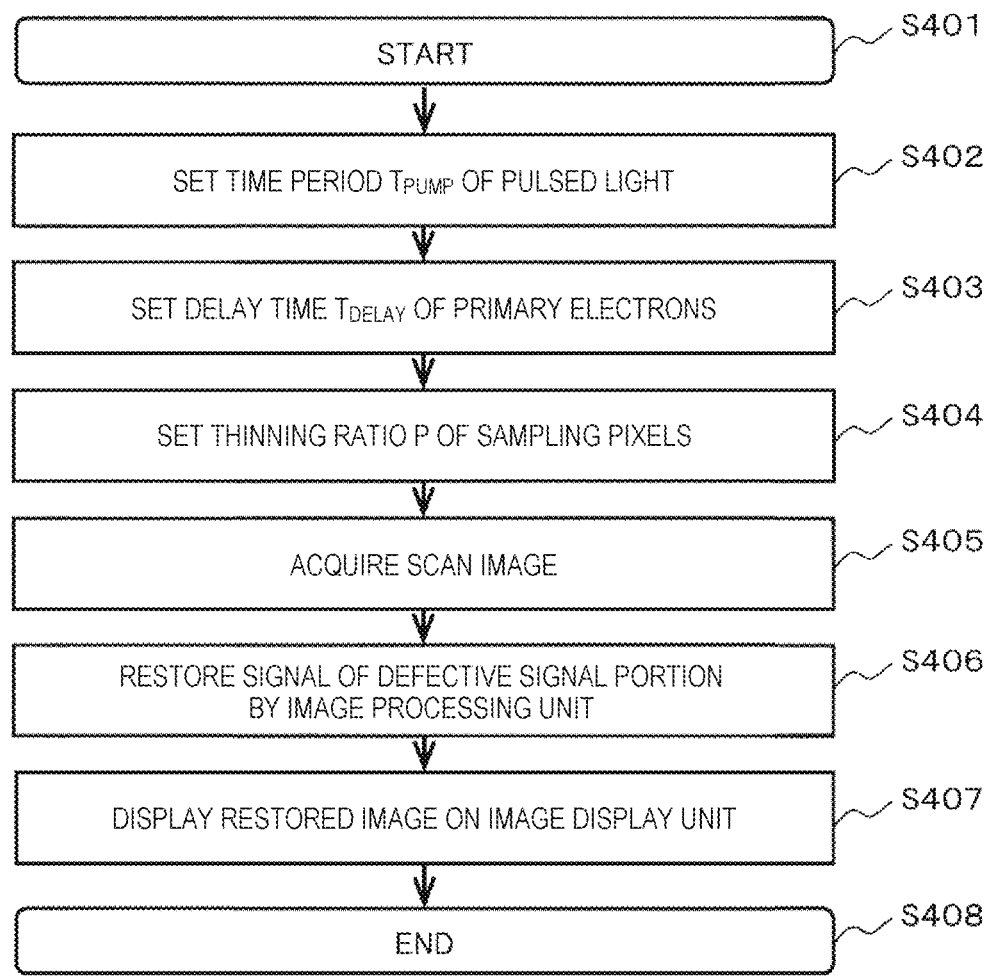
[FIG. 4]

[FIG. 5]
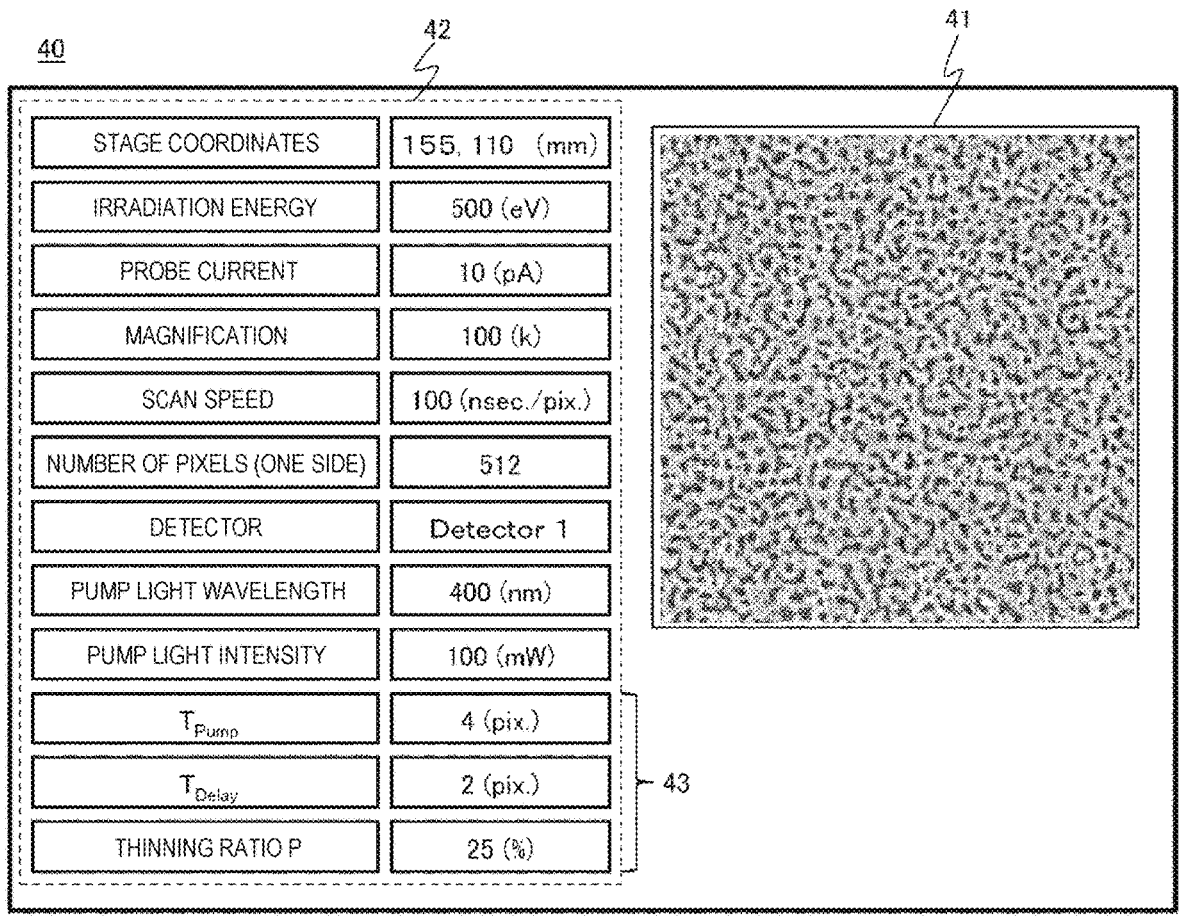

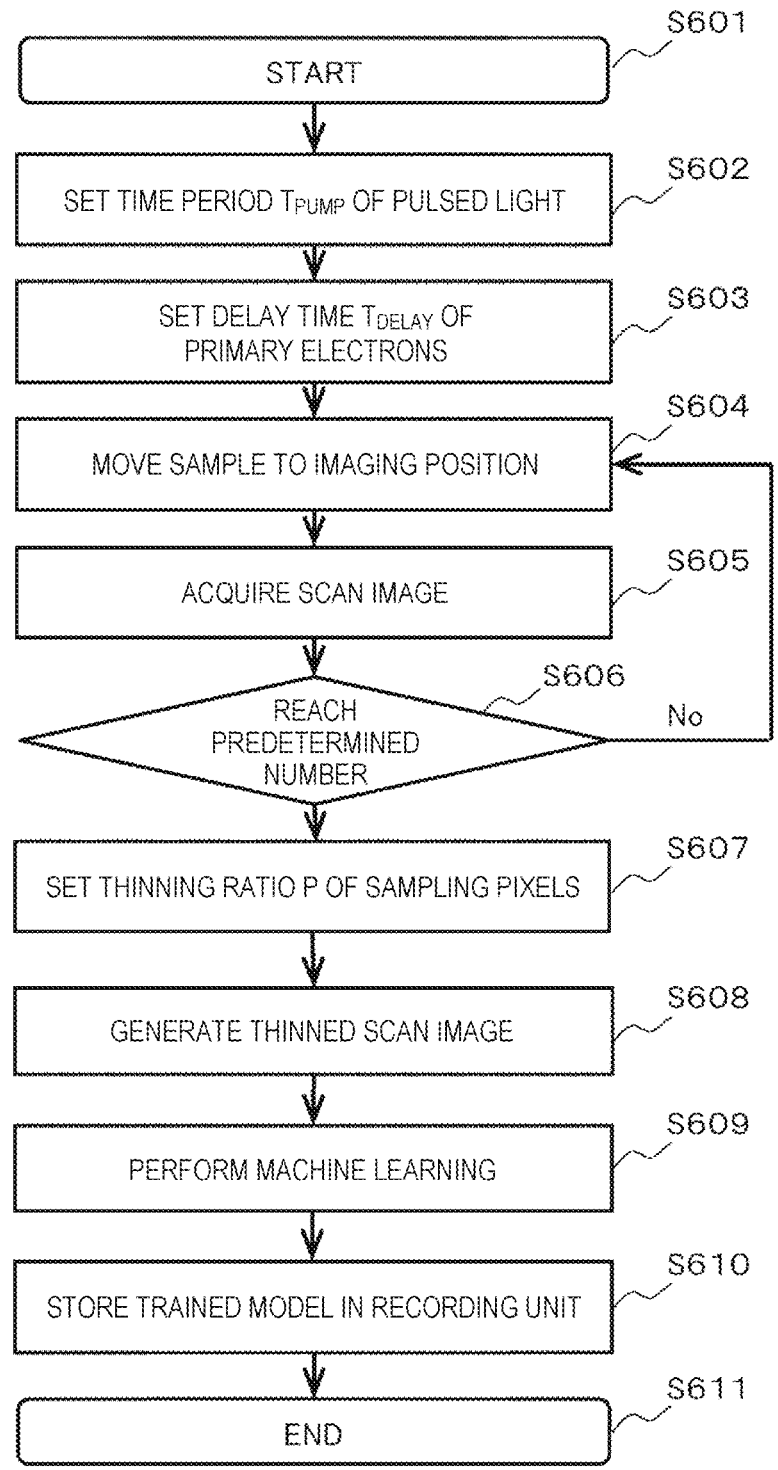
[FIG. 6]

[FIG. 7]
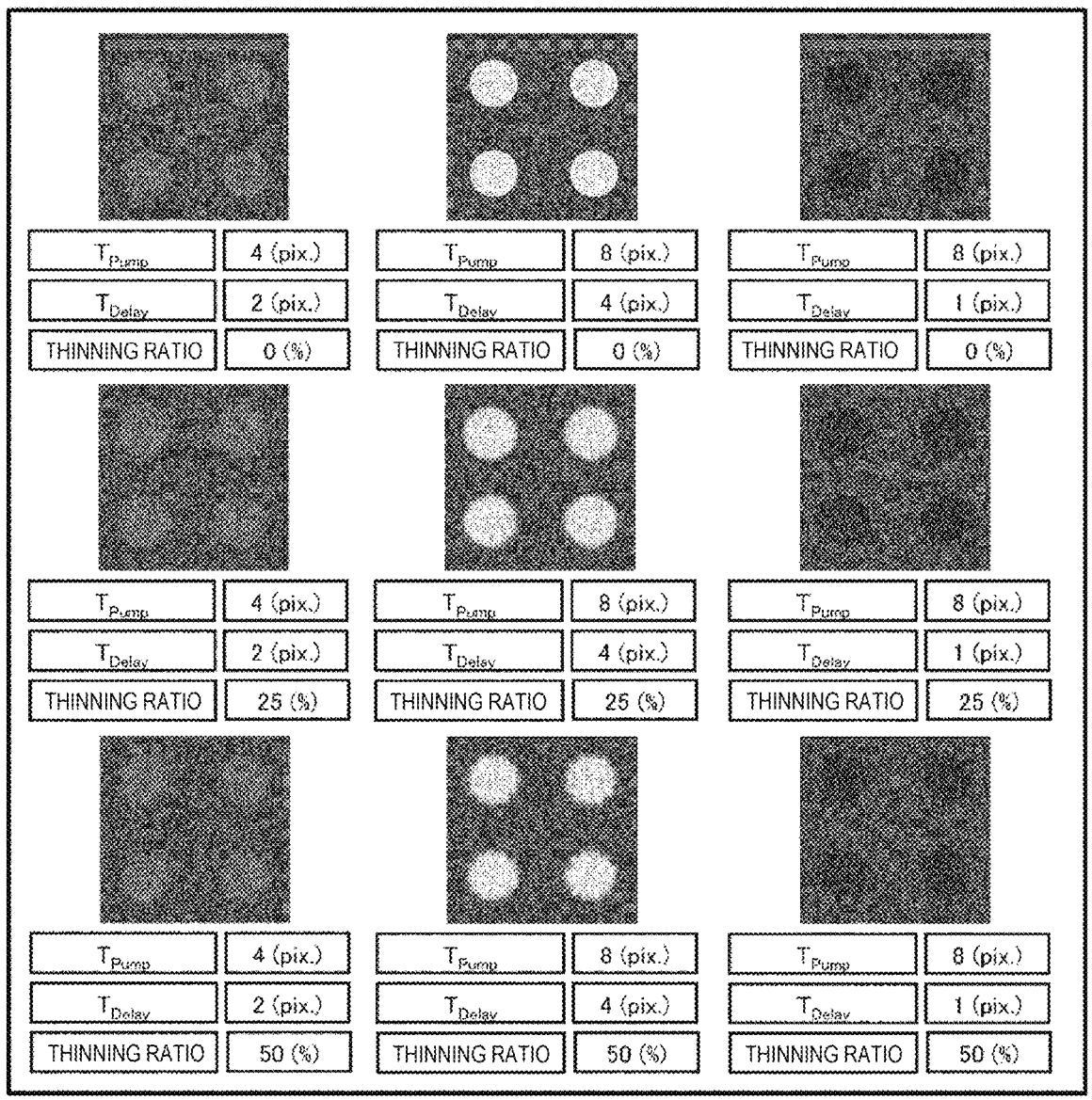

[FIG. 8]
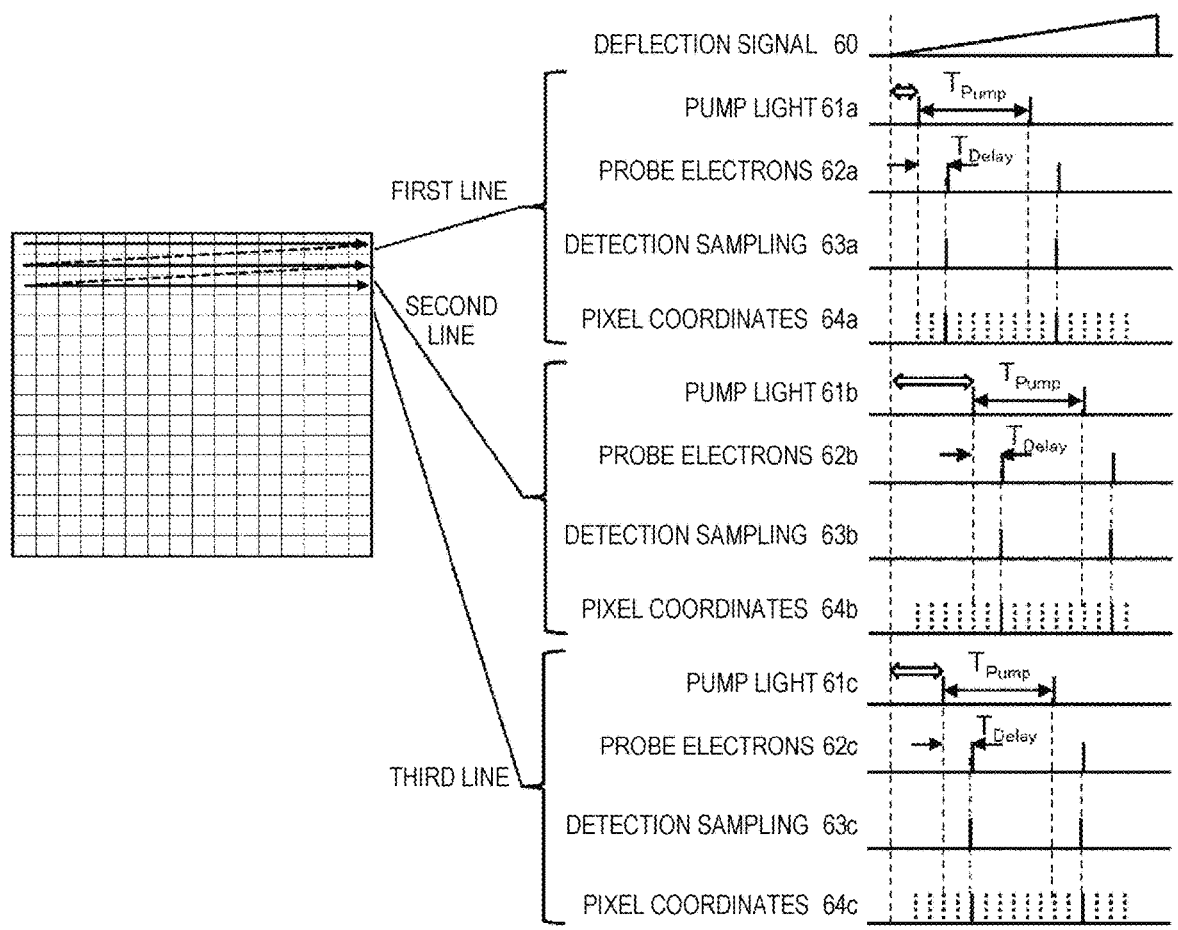

[FIG. 9]
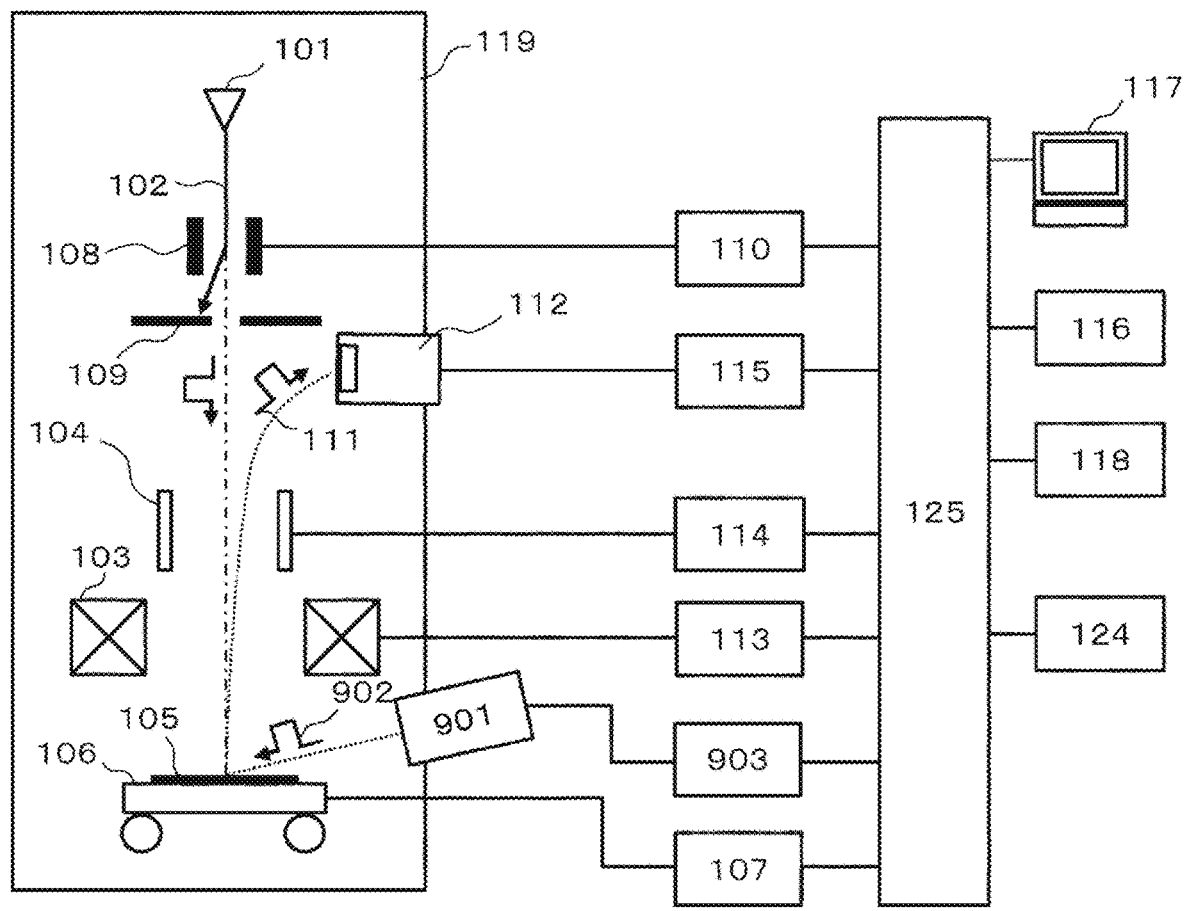
[FIG. 10]
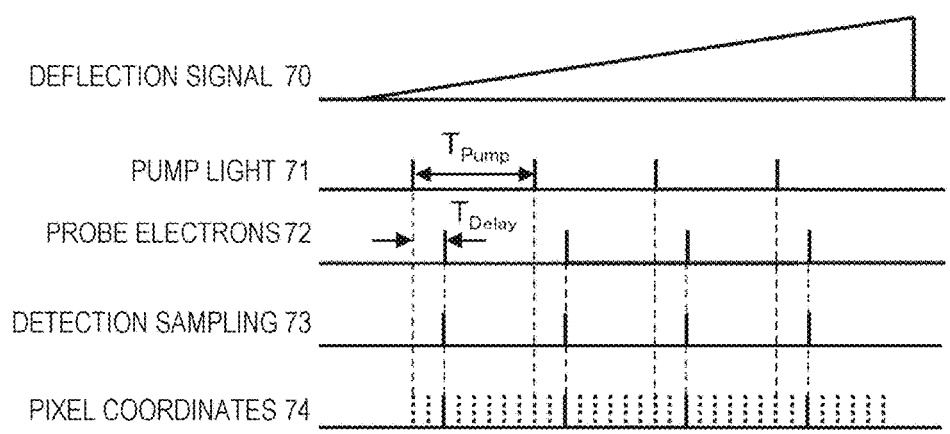

CHARGED PARTICLE BEAM DEVICE AND SAMPLE OBSERVATION METHOD

TECHNICAL FIELD

The present disclosure relates to a pump-probe charged particle beam device that irradiates a sample with pump light or pump charged particles and then detects secondary charged particles generated from the sample based on irradiation of probe charged particles in a predetermined timing, and a sample observation method using the same.

BACKGROUND ART

A charged particle beam device such as an electron microscope or an ion microscope is used for observation of various samples having a fine structure. For example, for a purpose of process management in a manufacturing process of a semiconductor device, a scanning electron microscope that is one of charged particle beam devices is applied to measurement such as dimension measurement or defect inspection of a semiconductor device pattern formed on a semiconductor wafer that is a sample.

In recent years, three-dimensionalization of semiconductor devices and diversification of materials to be used have been developed, and there have been increasing needs for inspection and measurement of electrical characteristics and material characteristics. In response to such new needs, each of PTL 1 and PTL 2 discloses that a pump-probe electron microscope is effective, which acquires an image by irradiating a sample with pulsed light and then irradiating the sample with a pulsed electron beam.

Specifically, PTL 1 discloses a method for observing a stacking fault in a sample by irradiation with a pulse laser having energy corresponding to a defect level in a semiconductor. PTL 2 discloses a method for acquiring an image with a high contrast by controlling a charged state, by adjusting, for a resist material used in an exposure process of manufacturing a semiconductor device, a time period of a pulse laser with which the resist material is irradiated.

CITATION LIST

Patent Literature

PTL 1: WO2019/102603
PTL 2: WO2020/053967

SUMMARY OF INVENTION

Technical Problem

In the scanning electron microscope having a pump-probe function disclosed in PTL 1 or PTL 2, detection signals cannot be acquired for all pixel positions by scanning with the electron beam once. This problem will be described with reference to FIGS. 1A and 1B. The scanning electron microscope forms a scan image by scanning a sample with primary electrons and detecting secondary electrons generated by scanning with the primary electrons.

FIG. 1A is a time chart of a deflection signal 10 for scanning with primary electrons, a primary electron irradiation timing 11, a detection sampling timing 12, and pixel coordinates 13 in a normal scanning electron microscope (that does not use the pump-probe function). Since the primary electrons are continuously applied and detection sampling is performed at all the pixel coordinates, signals of secondary electrons can be detected at all pixel coordinates by scanning with the primary electrons once.

FIG. 1B is a time chart of a deflection signal 20, a pump light irradiation timing 21, a probe electron irradiation timing 22, a detection sampling timing 23, and pixel coordinates 24 in the pump-probe scanning electron microscope. In the pump-probe scanning electron microscope, pump light for changing a state such as a charged state, an electron state, and a temperature of a sample is applied in a time period $T_{Pump}$, probe electrons for forming a scan image are applied with a delay time $T_{Delay}$ with respect to the pump light, and detection sampling is performed according to an irradiation timing of the probe electrons. Strictly speaking, since there is also a delay time until the secondary electrons generated in the sample reach a detector, a delay time is formed between the irradiation timing of the probe electrons and the detection sampling timing, but the delay time is omitted here.

Therefore, in the pump-probe scanning electron microscope, signals of the secondary electrons cannot be detected at all pixel coordinates by scanning the primary electrons only once, and in order to detect the signals of the secondary electrons at all pixel coordinates, it is necessary to scan with the primary electrons a plurality of times (at least eight times in this example) by shifting the pixel coordinates of the pump light and the probe electrons.

As described above, the pump-probe scanning electron microscope is characterized in that an imaging time is longer than that of the normal scanning electron microscope. Therefore, when the pump-probe scanning electron microscope is used for dimension measurement or defect inspection of a semiconductor device pattern, a problem of a decrease in throughput is caused.

Solution to Problem

According to an embodiment of the invention, a charged particle beam device includes: a charged particle optical system including a deflector, the charged particle optical system being configured to scan a sample with a pulsed charged particle beam by the deflector; a light source configured to irradiate the sample with pulsed light; a detector configured to detect secondary charged particles generated by irradiation on the sample with the charged particle beam; an image formation unit configured to form a scan image based on a signal from the detector; and a control unit configured to control the light source, the charged particle optical system, and the detector such that a deflection signal for deflecting the charged particle beam in a first direction, a first timing for irradiating the sample with the pulsed light, a second timing for irradiating the sample with the charged particle beam, and a third timing for detecting the secondary charged particles by the detector are synchronized.

When a deflection amount of the charged particle beam in the first direction in a time period of the first timing corresponds to coordinates of n pixels in the scan image, the control unit scans a same line m times (m<n) while shifting the first timing with respect to the deflection signal such that a location irradiated with the charged particle beam by each scanning in the first direction has different pixel coordinates.

The image formation unit restores a pixel value at pixel coordinates at which a signal is defective based on an integration scan image in which m scan images obtained by m times of scanning are integrated.

Advantageous Effects of Invention

An imaging time of the charged particle beam device having a pump-probe function can be shortened.

Other problems and novel features will be apparent from description of the present specification and the accompanying drawings.

BRIEF DESCRIPTION OF DRAWINGS

FIG. 1A is a time chart of scan image formation in a normal scanning electron microscope.
FIG. 1B is a time chart of scan image formation in a pump-probe scanning electron microscope.
FIG. 2 is a configuration diagram of a scanning electron microscope according to a first embodiment.
FIG. 3 is a diagram showing scan image formation by integration.
FIG. 4 is an image restoration flow in a pump-probe scanning electron microscope.
FIG. 5 is an example of a condition setting screen.
FIG. 6 is a machine learning flow for image restoration.
FIG. 7 is an example of an optimization condition setting screen.
FIG. 8 is a time chart of the scan image formation for preventing occurrence of an artifact.
FIG. 9 is a configuration diagram of a scanning electron microscope according to a second embodiment.
FIG. 10 is a time chart of scan image formation in a pump-probe scanning electron microscope according to the second embodiment.

DESCRIPTION OF EMBODIMENTS

Hereinafter, embodiments of the invention will be described. Although the drawings shown in the embodiments show specific embodiments according to the principle of the invention, these are for the purpose of understanding the invention and are not used to limit the invention. In the following embodiments, a scanning electron microscope using electrons as charged particles will be described as an example, but the same effect can be obtained even when various ions are used as charged particles.

First Embodiment

FIG. 2 shows a configuration of a scanning electron microscope according to a first embodiment.

The scanning electron microscope includes an electron beam optical system that irradiates a sample with an electron beam, a detection system that detects secondary electrons emitted from the sample due to irradiation with the electron beam, a stage mechanism system that is disposed in a vacuum chamber, a control system that controls components of the scanning electron microscope and processes various kinds of information, and an image processing system that executes processing such as image restoration on an obtained scan image.

Specifically, primary electrons 102 generated by an electron source 101 are deflected by a deflector 104 and focused by an objective lens 103, and then a sample 105 mounted on a movable stage 106 is irradiated with the primary electrons 102. An operation of the objective lens 103 is controlled by an objective lens control unit 113, an operation of the deflector 104 is controlled by a deflector control unit 114, and an operation of the movable stage 106 is controlled by a stage control unit 107. A negative voltage may be applied to the sample 105 via the movable stage 106.

In order to add a pump-probe function to the scanning electron microscope, the primary electrons 102 need to be pulsed. This is implemented by a blanking electrode 108 and an aperture 109. When a voltage is applied to the blanking electrode 108, the primary electrons 102 are deflected and collide with the aperture 109. On the other hand, when no voltage is applied to the blanking electrode 108, the primary electrons 102 pass through the aperture 109 and are applied to the sample 105. Therefore, the primary electrons 102 can be pulsed by controlling the voltage applied to the blanking electrode 108. An operation of the blanking electrode 108 is controlled by a blanking control unit 110. In this example, the primary electrons 102 are pulsed by the blanking electrode 108, but a method for pulsing the primary electrons 102 is not limited thereto. For example, the electron source 101 may be a photocathode and the electron source 101 may be irradiated with a pulsed laser, or a voltage (not shown) for extracting the primary electrons 102 from the electron source 101 may be pulsed.

Pulsed secondary electrons 111 generated by irradiation on the sample 105 with the primary electrons 102 pulsed by the blanking electrode 108 and the aperture 109 are detected by a detector 112. Although the detector 112 is disposed closer to the electron source 101 than is the deflector 104 in the configuration shown in FIG. 2, the detector 112 may be disposed between the deflector 104 and the objective lens 103 or between the objective lens 103 and the sample 105 as long as the detector 112 can detect the secondary electrons 111. Examples of a configuration of the detector 112 include an E-T detector and a semiconductor detector each including a scintillator, a light guide, and a photomultiplier tube, but any detector may be used as long as the detector 112 has a configuration capable of detecting electrons. The detector 112 may be mounted at a plurality of positions. A timing at which a signal for forming a scan image is acquired from the detector 112 is controlled by a detection sampling control unit 115.

An image formation unit 116 assigns the signal acquired by the detection sampling control unit 115 to pixel coordinates of the primary electrons 102 determined by the deflector control unit 114 to form a scan image. The generated scan image is displayed on an image display unit 117 and recorded in a recording unit 118.

The electron source 101, the blanking electrode 108, the aperture 109, the detector 112, the deflector 104, the objective lens 103, the sample 105, and the movable stage 106 are accommodated in a housing 119, and the inside of the housing 119 is maintained in a vacuum state by a vacuum pump (not shown).

In order to change a state of the sample 105, a pulsed laser 120 is installed outside the housing 119, and pulsed light 121 emitted from the pulsed laser 120 passes through a port 122 attached to the housing 119 and is applied to the sample 105. Here, a wavelength of the pulsed light 121 is typically in a range of ultraviolet light to visible light, but a microwave, a terahertz wave, an X-ray, or a y-ray may be used as long as the light is pulsed. An irradiation timing of the pulsed light 121 generated by the pulsed laser 120 is controlled by a pulsed laser control unit 123.

Operations of the stage control unit 107, the blanking control unit 110, the objective lens control unit 113, the deflector control unit 114, the detection sampling control unit 115, the image formation unit 116, the image display unit 117, the recording unit 118, the pulsed laser control unit 123, and an image processing unit 124 to be described later are controlled by a workstation (control unit) 125.

A method for executing image restoration in the pump-probe scanning electron microscope shown in FIG. 2 will be described. As shown in FIG. 1B, in the pump-probe scanning electron microscope, signals of all pixel coordinates cannot be detected only by scanning once. For example, when the pulsed light 121 and the primary electrons 102 are applied every four pixels, it is necessary to scan four times while shifting an irradiation timing of the pulsed light 121 and the primary electrons 102 with respect to a deflection signal by one pixel. At this time, a relationship between a scan image (schematic diagram) obtained by each scanning and a finally obtained scan image (schematic diagram) is shown in FIG. 3. Black vertical lines appearing in scan images 31 to 34 indicate that no signal is recorded, and it can be confirmed that each of the scan images 31 to 34 has signals only in discrete pixels. In the related-art pump-probe scanning electron microscope, the first to fourth scan images 31 to 34 obtained by scanning four times are integrated to obtain a scan image (integration scan image) 35 in which signals of all pixel coordinates are recorded. When the pump-probe scanning electron microscope scans a plurality of times by shifting the irradiation timing of the pulsed light 121 and the primary electrons 102 with respect to the deflection signal, each line or each frame may be repeatedly scanned. The same applies to the following embodiments and modifications.

On the other hand, in the present embodiment, in order to reduce the number of times of scanning and improve a throughput of the pump-probe scanning electron microscope, image restoration is executed by predicting signals of pixels in which no signal is recorded based on an image in which signals of only in a part of pixels are recorded. FIG. 4 shows a specific flow. After a sample is inserted, a time period $T_{Pump}$ of the pulsed light 121 is set (S402), and a delay time $T_{Delay}$ of the primary electrons 102 with respect to the pulsed light 121 is set (S403). Next, a thinning ratio P of sampling pixels is set (S404). For example, when the time period $T_{Pump}$ is set to correspond to four pixels, electron beam scanning of four times are required in order to obtain signals in all pixels (thinning ratio P=0). When the thinning ratio P is set to 25%, in an example shown in FIG. 3, in order to obtain any three scan images among the scan images 31 to 34, the electron beam scanning is performed three times.

Various observation conditions including conditions set in steps S402 to S404 can be set via a GUI displayed on the image display unit 117. FIG. 5 shows an example of a condition setting screen. A condition setting screen 40 includes a scan image display section 41 and an observation condition setting section 42. The observation condition setting section 42 includes an observation condition setting section 43 set in steps S402 to S404. A normal scan image (without using the pump-probe function) acquired by the pump-probe scanning electron microscope or a pump-probe scan image can be displayed in the scan image display section 41. Thereby, search in an observation field of view and adjustment on the observation conditions including an image restoration condition can be performed while confirming the image in the scan image display section 41.

Next, a scan image is acquired under the set observation conditions (S405). Then, signals of pixels in which no signal is recorded are restored based on an integration scan image in which scan images acquired by the image processing unit 124 are integrated (S406), and the restored image (restored scan image) is displayed on the image display unit 117 (S407).

Here, image restoration executed in S406 can be executed using a dictionary stored in the recording unit 118. It is known that non-defective image data can be obtained by restoration from image data in which pixel data is partially defective by sparse modeling. By storing, in the recording unit 118, base images (a set of base images is referred to as the dictionary) used for sparse modeling trained using a pump-probe scan image acquired in advance, it is possible to estimate signals of all pixels of the pump-probe scan image based on the pump-probe scan image in which some pixels are thinned out. Alternatively, the image restoration may be executed using a processing algorithm of machine learning stored in the recording unit 118. A specific learning method in this case will be described later. By using either method, it is possible to reduce an image acquisition time of the scan image according to the thinning ratio P of sampling pixels, as compared with the related-art pump-probe scanning electron microscope.

FIG. 6 shows a flow of machine learning for image restoration. The machine learning according to the present embodiment is supervised learning, and requires a scan image in which signals of all pixels are recorded as training data. Therefore, after the time period $T_{Pump}$ (S602) of the pulsed light 121 and the delay time $T_{Delay}$ (S603) of the primary electrons 102 are set, the sample 105 is moved to an imaging position by the movable stage 106 (S604), and a scan image is acquired (S605). The scan image acquired in step S605 is an integration scan image in which signals are recorded in all pixels, which is obtained by scanning a plurality of times at the thinning ratio P=0% and integrating scan images. Movement of the imaging position and acquisition of the scan image are repeated a predetermined number of times to acquire a sufficient number of scan images for learning (S606). The acquired scan image is recorded in the recording unit 118. Thereafter, the thinning ratio P of sampling pixels is set (S607), and a thinned scan image is generated from the scan image acquired in step S605 according to the set thinning ratio P (S608). Then, machine learning is performed such that the scan image acquired in step S605 can be reproduced from the thinned scan image generated in step S608 (S609). Here, a deep neural network, convolutional neural networks, generative adversarial networks, and the like can be used as an example of a learning algorithm. In addition, any algorithm can be applied as long as the algorithm can estimate, based on a thinned scan image, a scan image in which signals of all pixels are recorded. A trained model obtained by the machine learning is stored in the recording unit 118 (S610), and the flow ends. Signals of a defective signal portion are restored using the trained model stored in the recording unit 118 (S406). Instead of creating a scan image with the predetermined thinning ratio P in a pseudo manner based on an integration scan image with the thinning ratio P=0%, an integration scan image acquired while actually changing the thinning ratio P may be used for learning.

Here, in the pump-probe scanning electron microscope, a contrast of the obtained scan image is changed by changing the time period $T_{Pump}$ of the pulsed light 121 and the delay time $T_{Delay}$ of the primary electrons 102. When the thinning ratio P of sampling pixels is increased, an image acquisition time is shortened, but a probability that an artifact, which is an image not actually existing in the restored image, is mixed increases.

Therefore, it is desirable that a user can search for an observation condition that provides an optimum contrast and an optimum image acquisition time. Therefore, in the pump-probe scanning electron microscope according to the present embodiment, a scan image obtained by executing image restoration under a plurality of conditions for the time period $T_{Pump}$ of the pulsed light 121, the delay time $T_{Delay}$ of the primary electrons 102, and the thinning ratio P of sampling pixels is displayed on the image display unit 117. FIG. 7 shows an example of an optimization condition setting screen. The optimization condition setting screen 50 may be called, for example, by providing an optimization button on the condition setting screen 40 shown in FIG. 5 and pressing the optimization button. In this case, it is desirable to set a plurality of conditions based on the time period $T_{Pump}$ of the pulsed light 121 and the delay time $T_{Delay}$ of the primary electrons 102 set in the observation condition setting section 43 of the condition setting screen 40. The user may directly set the plurality of conditions.

In general, a contrast of the scan image tends to change when the time period $T_{Pump}$ of the pulsed light 121 and the delay time $T_{Delay}$ of the primary electrons 102 are changed, and artifacts tend to increase when the thinning ratio P is increased. Therefore, in the example shown in FIG. 7, three types of combinations of the time period $T_{Pump}$ of the pulsed light 121 and the delay time $T_{Delay}$ of the primary electrons 102 and three types of thinning ratios P are set, and nine pump-probe images are acquired in total by the combinations and displayed on the optimization condition setting screen 50. Each column has the same combination of the time period $T_{Pump}$ of the pulsed light 121 and the delay time $T_{Delay}$ of the primary electrons 102, and the thinning ratios P are set to 0%, 25%, and 50% from the top. As a schematic diagram, in the pump-probe image, a circle represents a pattern, a difference in color between the circle and a background represents a contrast, and a deviation in a shape of the circle represents an artifact.

The user selects a desired scan image from the scan images displayed on the optimization condition setting screen 50 in consideration of a relationship between the contrast and the artifact. The time period $T_{Pump}$ of the pulsed light 121, the delay time $T_{Delay}$ of the primary electrons 102, and the thinning ratio P of sampling pixels of the selected scanned image are set as conditions for acquiring the scan image.

In this example, the number of conditions for acquiring the pump-probe image is nine, but the number is not limited thereto. First, the thinning ratio P may be fixed to 0%, and the conditions of the time period $T_{Pump}$ of the pulsed light 121 and the delay time $T_{Delay}$ of the primary electrons 102 may be changed to search for conditions for obtaining a scan image with a good contrast, and then, the two conditions may be fixed and only the thinning ratio P may be changed to finally set the three conditions. This makes it possible to efficiently search for conditions for obtaining a good pump-probe image.

Further, a method for reducing artifacts during image restoration in the pump-probe scanning electron microscope will be described. In general, in a process of restoring an original image based on a sparse sampling image, an artifact is less likely to appear when sampling is random. However, in the pump-probe scanning electron microscope, the scan image needs to be acquired with a plurality of time periods $T_{Pump}$ of the pulsed light 121 and the delay time $T_{Delay}$ of the primary electrons 102 kept constant. Therefore, sampling intervals are equal, and there is a tendency that an artifact is likely to occur in the restored image.

FIG. 8 shows a time chart of a deflection signal 60 for scanning primary electrons, a pump light irradiation timing 61, a probe electron irradiation timing 62, a detection sampling timing 63, and pixel coordinates 64 for preventing occurrence of an artifact. Although FIG. 8 shows an example in which the primary electrons 102 are emitted for scanning in a horizontal direction, the same effect can be attained even when the primary electrons 102 are emitted for scanning in a vertical direction. During scanning of a first line, the time period $T_{Pump}$ of the pulsed light 121 and the delay time $T_{Delay}$ of the primary electrons 102 are fixed, and detection sampling is also performed at equal intervals. During scanning of a second line, the time period $T_{Pump}$ of the pulsed light 121 and the delay time $T_{Delay}$ of the primary electrons 102 are the same as those of the first line, but an irradiation start timing of the pulsed light 121 is set to a timing different from that of the first line, and the same applies to the third and subsequent lines. As described above, the time period $T_{Pump}$ of the pulsed light 121, the delay time $T_{Delay}$ of the primary electrons 102, and a shift amount change pattern of an irradiation timing of the pulsed light 121 with respect to the deflection signal 60 for each m times of scanning are the same in a plurality of lines, while an initial shift amount of the irradiation timing of the pulsed light 121 with respect to the deflection signal 60 is different for each of the plurality of lines, whereby it is possible to perform sampling with increased randomness in a direction orthogonal to a scanning direction of the primary electrons 102 while fixing the time period $T_{Pump}$ of the pulsed light 121 and the delay time $T_{Delay}$ of the primary electrons 102.

An irradiation start timing of the pulsed light 121 in each line may be determined by the workstation (control unit) 125 generating a random number when scanning of each line is started, or the irradiation start timing may be controlled by reading an irradiation start timing recorded in the recording unit 118 in advance. Since occurrence of an artifact is affected by a shape of a pattern, a scan image or a design pattern of an observation target may be input, a correspondence table of an irradiation start timing corresponding to a predetermined pattern may be stored in advance in the recording unit 118, and an irradiation start timing may be determined by comparing the correspondence table with the input scan image or design pattern. Alternatively, a trained model in which a pattern and a preferable irradiation start timing are trained may be created, and an irradiation start timing may be obtained using the trained model.

Second Embodiment

In the first embodiment, an example in which a pulsed laser is used as a pump source has been described. However, it is effective even when a charged particle source of an electron beam or the like is used as a pump source, and a configuration in which a charged particle source is used as a pump source will be described as a second embodiment.

FIG. 9 shows a configuration of a scanning electron microscope according to the second embodiment. The same components as those according to the first embodiment are denoted by the same reference numerals, and repeated description thereof will be omitted. In the configuration shown in FIG. 9, the pulsed laser 120, the port 122, and the pulsed laser control unit 123 for irradiation of pump light are removed from the configuration shown in FIG. 2, a pulsed electron source 901 is attached to the housing 119, and the sample 105 is irradiated with pulsed electrons 902 generated by the pulsed electron source 901. The pulsed electron source 901 is controlled by a pulsed electron source control unit 903. A charged particle beam source that irradiates another pulsed charged particle beam such as ions may be mounted instead of the pulsed electron source 901.

A detection sampling method in a case of using an electron beam as the pump source will be described with reference to FIG. 10. FIG. 10 is a time chart of a deflection signal 70, a pump electron irradiation timing 71, a probe electron irradiation timing 72, a detection sampling timing 73, and pixel coordinates 74 in the pump-probe scanning electron microscope according to the second embodiment.

When electrons are used as the pump source, the secondary electrons 111 are generated from the sample 105 by both irradiation of pump electrons and irradiation of probe electrons, and by matching a detection sampling timing with a probe electron irradiation timing, the secondary electrons 111 generated by the probe electrons are detected and a scan image is formed.

Irradiation energy of the pump electrons and the probe electrons to the sample 105 may be the same or different. As a method for changing the irradiation energy of the pump electrons, an acceleration voltage of the pulsed electron source 901 is set to a value different from that of the electron source 101, or a voltage (retarding voltage) applied to the sample 105 is changed at the time of irradiation of the pump electrons and the probe electrons. It is desirable that a spot diameter of the pump electrons is set to a sufficient size for an observation field of view such that a probe current amount does not greatly vary for each pixel coordinate.

The electron source 101 may also be used as a pump electron source. A configuration of the scanning electron microscope in this case is obtained by removing the pulsed laser 120, the port 122, and the pulsed laser control unit 123 from the configuration shown in FIG. 2. As in a case of the probe electrons, the pump electrons are also pulsed by pulsing the primary electrons 102 by the blanking electrode 108 and the aperture 109. The pump electrons may be defocused from the probe electrons. However, when a distance between an irradiation location of the pump electrons and an irradiation location of the probe electrons is equivalent to several pixels, an influence of the pump electrons can be generally observed at the irradiation location of the probe electrons without changing irradiation conditions of the primary electrons 102, although depending on a pattern to be observed.

The invention has been described above with reference to the embodiments and modifications. The embodiments and modifications described above may be modified in various ways without departing from the scope of the invention, and may be used in combination.

REFERENCE SIGNS LIST 10, 20, 60, 70: deflection signal
11: primary electron irradiation timing
12, 23, 63, 73: detection sampling timing
13, 24, 64, 74: pixel coordinates
21, 61: pump light irradiation timing
22, 62, 72: probe electron irradiation timing
31 to 35: scan image
40: condition setting screen
41: scan image display section
42, 43: observation condition setting section
50: optimization condition setting screen
71: pump electron irradiation timing
101: electron source
102: primary electrons
103: objective lens
104: deflector
105: sample
106: movable stage
107: stage control unit
108: blanking electrode
109: aperture
110: blanking control unit
111: secondary electrons
112: detector
113: objective lens control unit
114: deflector control unit
115: detection sampling control unit
116: image formation unit
117: image display unit
118: recording unit
119: housing
120: pulsed laser
121: pulsed light
122: port
123: pulsed laser control unit
124: image processing unit
125: workstation (control unit)
901: pulsed electron source
902: pulsed electrons
903: pulsed electron source control unit

The invention claimed is:

1. A charged particle beam device comprising:
a charged particle optical system including a deflector, the charged particle optical system being configured to scan a sample with a pulsed charged particle beam by the deflector;
a light source configured to irradiate the sample with pulsed light;
a detector configured to detect secondary charged particles generated by irradiation on the sample with the charged particle beam;
an image formation unit configured to form a scan image based on a signal from the detector; and
a control unit configured to control the light source, the charged particle optical system, and the detector such that a deflection signal for deflecting the charged particle beam in a first direction, a first timing for irradiating the sample with the pulsed light, a second timing for irradiating the sample with the charged particle beam, and a third timing for detecting the secondary charged particles by the detector are synchronized, wherein
when a deflection amount of the charged particle beam in the first direction in a time period of the first timing corresponds to coordinates of n pixels in the scan image, the control unit scans a same line m times (m<n) while shifting the first timing with respect to the deflection signal such that a location irradiated with the charged particle beam by each scanning in the first direction has different pixel coordinates, and
the image formation unit restores a pixel value at pixel coordinates at which a signal is defective based on an integration scan image in which m scan images obtained by m times of scanning are integrated.

2. The charged particle beam device according to claim 1, further comprising:
an image display unit, wherein
the control unit displays, on the image display unit, a restored scan image in which the pixel value at the pixel coordinates at which the signal is defective is restored.

3. The charged particle beam device according to claim 2, wherein
the control unit receives setting of the time period of the first timing, a delay time from the first timing to the second timing, and a thinning ratio, and sets a value of m according to the thinning ratio.

4. The charged particle beam device according to claim 3, wherein
in setting the time period of the first timing and the delay time from the first timing to the second timing, the control unit displays, on the image display unit, a plurality of integration scan images, in each of which n scan images obtained by scanning at a thinning ratio of 0% are integrated, under a plurality of conditions in which the time period of the first timing and the delay time from the first timing to the second timing are different from each other.

5. The charged particle beam device according to claim 4, wherein
the control unit displays, on the image display unit, a plurality of restored scan images restored based on integration scan images, in each of which m scan images obtained by scanning at a different thinning ratio are integrated, under conditions including the set time period of the first timing and the set delay time from the first timing to the second timing.

6. The charged particle beam device according to claim 1, wherein
the control unit scans a plurality of lines by moving a scanning start position in the first direction to a second direction orthogonal to the first direction, and
the control unit varies an initial shift amount of the first timing with respect to the deflection signal for each of the plurality of lines.

7. The charged particle beam device according to claim 6, wherein
the initial shift amount of the first timing with respect to the deflection signal is set to be random or a value set in advance for each of the plurality of lines.

8. The charged particle beam device according to claim 1, further comprising:
a recording unit configured to store a dictionary in which a base image is recorded, wherein
the image formation unit restores, using the dictionary, the pixel value at the pixel coordinates at which the signal is defective, by sparse modeling, based on the integration scan image in which the m scan images are integrated.

9. The charged particle beam device according to claim 1, further comprising:
a recording unit configured to store a trained model, wherein
the image formation unit restores, using the trained model, the pixel value at the pixel coordinates at which the signal is defective based on the integration scan image in which m scan images are integrated.

10. The charged particle beam device according to claim 1, further comprising:
instead of the light source, a charged particle source configured to irradiate the sample with a charged particle beam pulsed in the first timing.

11. The charged particle beam device according to claim 10, wherein
the charged particle source is shared with a charged particle source of the charged particle optical system.

12. A sample observation method using a charged particle beam device,
the charged particle beam device including:
a charged particle optical system including a deflector, the charged particle optical system being configured to scan a sample with a pulsed charged particle beam by the deflector;
a light source configured to irradiate the sample with pulsed light;
a detector configured to detect secondary charged particles generated by irradiation on the sample with the charged particle beam;
an image formation unit configured to form a scan image based on a signal from the detector;
a control unit configured to control the light source, the charged particle optical system, and the detector such that a deflection signal for deflecting the charged particle beam in a first direction, a first timing for irradiating the sample with the pulsed light, a second timing for irradiating the sample with the charged particle beam, and a third timing for detecting the secondary charged particles by the detector are synchronized; and
an image display unit,
the sample observation method comprising:
by the control unit, when a deflection amount of the charged particle beam in the first direction in a time period of the first timing corresponds to coordinates of n pixels in the scan image, scanning a same line m times (m<n) while shifting the first timing with respect to the deflection signal such that a location irradiated with the charged particle beam by each scanning in the first direction has different pixel coordinates;
by the image formation unit, restoring a pixel value at pixel coordinates at which a signal is defective based on an integration scan image in which m scan images obtained by the m times of scanning are integrated; and
by the control unit, displaying, on the image display unit, a restored scan image in which the pixel value at the pixel coordinates at which the signal is defective is restored.

13. The sample observation method according to claim 12, wherein
the control unit receives setting of the time period of the first timing, a delay time from the first timing to the second timing, and a thinning ratio from a condition setting screen displayed on the image display unit, and sets a value of m according to the thinning ratio.

14. The sample observation method according to claim 13, wherein
in setting the time period of the first timing and the delay time from the first timing to the second timing, the control unit displays, on the image display unit, a plurality of integration scan images, in each of which n scan images obtained by scanning at a thinning ratio of 0% are integrated, under a plurality of conditions in which the time period of the first timing and the delay time from the first timing to the second timing are different from each other.

15. The sample observation method according to claim 12, wherein
the control unit scans a plurality of lines by moving a scanning start position in the first direction to a second direction orthogonal to the first direction, and
the control unit sets, for each of the plurality of lines, an initial shift amount of the first timing with respect to the deflection signal to be random for each of the plurality of lines, or a value set in advance to be different for each of the plurality of lines.

* * * * *